US012375075B2

(12) United States Patent
Fujii (10) Patent No.: US 12,375,075 B2
(45) Date of Patent: Jul. 29, 2025

(54) SEMICONDUCTOR DEVICE

(71) Applicant: FUJI ELECTRIC CO., LTD., Kawasaki (JP)

(72) Inventor: Masanari Fujii, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 41 days.

(21) Appl. No.: 18/398,475

(22) Filed: Dec. 28, 2023

(65) Prior Publication Data

US 2024/0272662 A1  Aug. 15, 2024

(30) Foreign Application Priority Data

Feb. 14, 2023  (JP) .................................. 2023-020685

(51) Int. Cl.
*H03K 17/08* (2006.01)

(52) U.S. Cl.
CPC ..... *H03K 17/08* (2013.01); *H03K 2217/0027* (2013.01)

(58) Field of Classification Search
None
See application file for complete search history.

(56) References Cited

U.S. PATENT DOCUMENTS

| 7,359,172 | B2* | 4/2008 | Honda | H03K 17/0822 |
| | | | | 361/103 |
| 7,365,559 | B2* | 4/2008 | Colbeck | G01R 19/0092 |
| | | | | 340/635 |
| 9,742,389 | B2* | 8/2017 | Maekawa | H03K 17/0828 |
| 9,825,555 | B2* | 11/2017 | Onishi | H03K 17/127 |
| 11,979,017 | B2* | 5/2024 | Yano | H03K 17/0822 |
| 12,126,330 | B2* | 10/2024 | Kumazawa | H03K 17/08126 |
| 12,199,526 | B2* | 1/2025 | Wada | H10D 30/669 |
| 2013/0285732 | A1 | 10/2013 | Mori | |
| 2014/0362490 | A1* | 12/2014 | Maekawa | H03K 17/0828 |
| | | | | 361/103 |

FOREIGN PATENT DOCUMENTS

| JP | 2012-085131 A | 4/2012 |
| JP | 2013-219633 A | 10/2013 |

* cited by examiner

*Primary Examiner* — Thomas J. Hiltunen
(74) *Attorney, Agent, or Firm* — Rabin & Berdo, P.C.

(57) ABSTRACT

A semiconductor device having: a semiconductor device unit including an output element and a sensing element; and a control circuit. When the output element is in an on state, the control circuit connects a high potential terminal of a sensing element to a high potential terminal of an output element and ungrounds a low potential terminal of the sensing element to cause the sensing element to function as a current sensing element for detecting a current flowing in the output element. When the output element is in an off state, the control circuit disconnects the high potential terminals of the sensing element and the output element, causes a constant current to flow through the high potential terminal of the sensing element, and grounds the low potential terminal of the sensing element to cause the sensing element to function as a temperature sensing element for detecting the temperature of the output element.

7 Claims, 12 Drawing Sheets

| $V_{MIN}$ | s2 | UNUSED | $V_{SIN}$ — T2 |
|---|---|---|---|
| CLK | D | Q | QN |
| 0 | 0 | HOLD | HOLD |
| 0 | 1 | HOLD | HOLD |
| 1 | 0 | 0 | 1 |
| 1 | 1 | 1 | 0 |

SEMICONDUCTOR DEVICE

CROSS-REFERENCE TO RELATED APPLICATION

This application is based upon and claims the benefit of priority of the prior Japanese Patent Application No. 2023-020685, filed on Feb. 14, 2023, the entire contents of which are incorporated herein by reference.

BACKGROUND OF THE INVENTION

1. Field of the Invention

The embodiments discussed herein relate to a semiconductor device.

2. Background of the Related Art

A semiconductor device, such as an intelligent power module (IPM), has a built-in semiconductor chip that includes a power semiconductor element, such as an insulated gate bipolar transistor (IGBT). Semiconductor chips are also equipped with a protection function that protects against abnormal conditions, such as an overcurrent and overheating.

As one example of a related technology, a driving circuit for a power transistor including a temperature detection element, which is integrally provided on the semiconductor substrate on which a power transistor is provided and generates a voltage in keeping with temperature based on a constant current outputted from a constant current source, has been proposed (see Japanese Laid-open Patent Publication No. 2013-219633). A power semiconductor device that includes a gate driving circuit for correcting the main gate resistance and the sensing gate resistance of the power semiconductor device and corrects any deviation in the current switch timing and transient characteristics between a main region and a sensing region has also been proposed (see Japanese Laid-open Patent Publication No. 2012-085131).

SUMMARY OF THE INVENTION

According to one aspect, there is provided a semiconductor device for driving a load, including: a semiconductor device unit, including an output element that performs switching to operate the load, the output element having a high potential terminal, and a sensing element having a high potential terminal and a low potential terminal; and a control circuit coupled to the semiconductor device unit, the control circuit being configured to be operable, when the output element is in an on state, to turn on the sensing element by connecting the high potential terminal of the sensing element to the high potential terminal of the output element and ungrounding the low potential terminal of the sensing element, to thereby cause the sensing element to function as a current sensing element for detecting a current flowing in the output element, and when the output element is in an off state, to cut off a connection between the high potential terminal of the sensing element and the high potential terminal of the output element, to supply a constant current from the high potential terminal of the sensing element in a state where the low potential terminal of the sensing element is grounded, to thereby turn on the sensing element and cause the sensing element to function as a temperature sensing element for detecting a temperature of the output element.

The object and advantages of the invention will be realized and attained by means of the elements and combinations particularly pointed out in the claims.

It is to be understood that both the foregoing general description and the following detailed description are exemplary and explanatory and are not restrictive of the invention.

DETAILED DESCRIPTION OF THE INVENTION

Several embodiments will be described below with reference to the accompanying drawings. Note that in this specification and the drawings, elements that have effectively the same configurations have been assigned the same reference numerals and duplicated description thereof is omitted.

Figure 1:
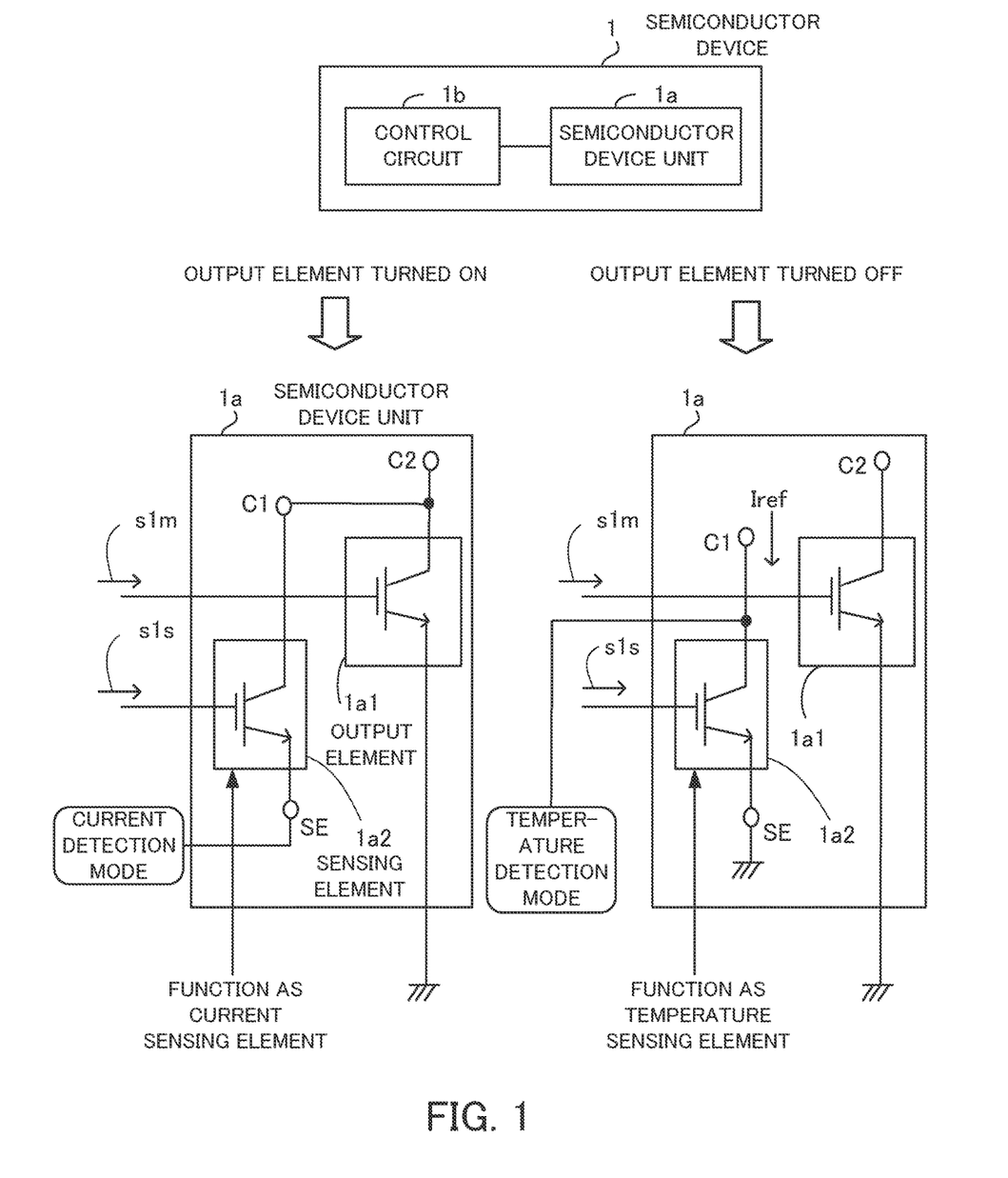
FIG. 1 depicts one example of a semiconductor device.

FIG. 1 depicts one example of a semiconductor device. A semiconductor device 1 includes a semiconductor device unit 1a and a control circuit 1b. The semiconductor device unit 1a includes an output element 1a1 and a sensing element 1a2.

As one example, the output element 1a1 is a voltage-controlled power semiconductor element, such as an IGBT or a metal-oxide-semiconductor field-effect transistor (MOSFET), and performs switching based on a driving signal s1m outputted from the control circuit 1b to operate a load. The sensing element 1a2 is for example a sensing IGBT, and is switched and driven based on a driving signal s1s outputted from the control circuit 1b.

In this configuration, the control circuit 1b enters a current detection mode when the output element 1a1 is turned on. As one example, the output element 1a1 is turned on when the driving signal s1m is outputted at an H-level.

In this case, the control circuit 1b connects a high potential terminal C1 (or "first high potential terminal") of the sensing element 1a2 to a high potential terminal C2 (or "second high potential terminal") of the output element 1a1 and ungrounds a low potential terminal SE of the sensing element 1a2. The control circuit 1b then turns on the sensing element 1a2 using the driving signal s1s and drives the sensing element 1a2 (as one example, the control circuit 1b outputs the driving signal s1s at an H level) to cause the sensing element 1a2 to function as a current sensing element for detecting the current flowing through the output element 1a1.

The control circuit 1b enters a temperature detection mode when the output element 1a1 is turned off. As one example, when the driving signal s1m is outputted at an L level, the output element 1a1 is turned off.

In this case, the control circuit 1b cuts off the connection between the high potential terminal C1 of the sensing element 1a2 and the high potential terminal C2 of the output element 1a1, supplies a constant current Iref to the high potential terminal C1, and grounds the low potential terminal SE of the sensing element 1a2. The control circuit 1b then turns on and drives the sensing element 1a2 using the driving signal s1s, which causes the sensing element 1a2 to function as a temperature sensing element for detecting the temperature of the output element 1a1.

In this way, the semiconductor device 1 is configured so that the control circuit 1b causes the sensing element 1a2 to function as a current sensing element or as a temperature sensing element based on whether the output element 1a1 is turned on or turned off.

By doing so, it is possible to use the same sensing element 1a2 to switch between both current detection and temperature detection for the output element 1a1 in keeping with the switching state of the output element 1a1. Unlike a conventional configuration, this eliminates the need for a temperature detection diode that is dedicated to detecting temperature, and makes it possible to simplify the manufacturing process and reduce the chip area.

Figure 2:
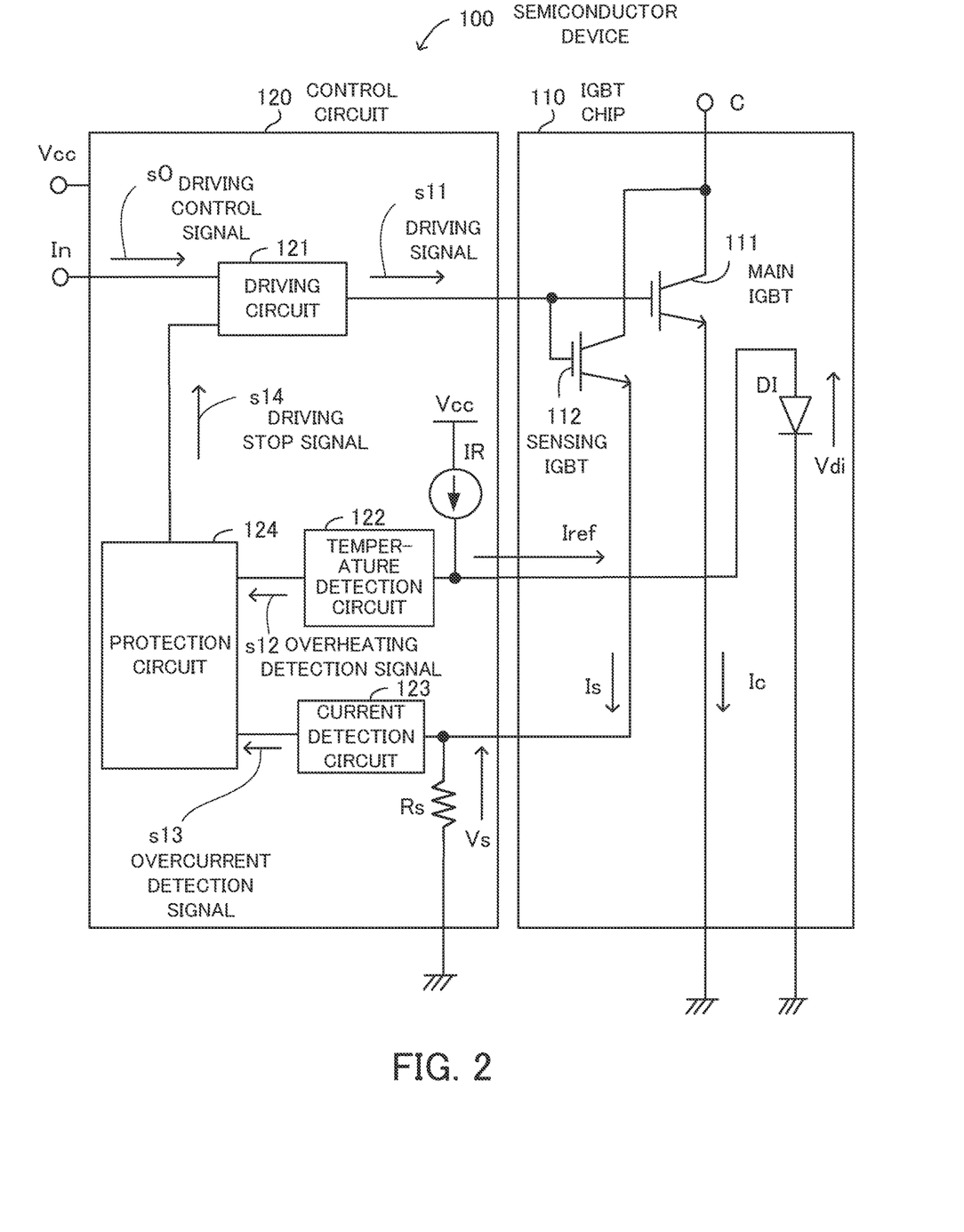
FIG. 2 depicts an example configuration of an unimproved semiconductor device.

Next, before describing the semiconductor device 1 according to the present disclosure in detail, a semiconductor device that uses a temperature detection diode will be described with reference to FIGS. 2 and 3. FIG. 2 depicts an example configuration of a semiconductor device that uses a temperature detection diode. The semiconductor device 100 includes an IGBT chip 110 and a control circuit 120. The IGBT chip 110 includes a main IGBT 111, a sensing IGBT 112, and a temperature detection diode DI. The control circuit 120 includes a driving circuit 121, a temperature detection circuit 122, a current detection circuit 123, a protection circuit 124, a constant current source IR, and a sensing resistor Rs.

In the IGBT chip 110, the main IGBT 111 operates a load by switching based on a driving signal s11. Note that a load (not illustrated) may be connected between the emitter of the main IGBT 111 and ground (GND). The sensing IGBT 112 is a power semiconductor element for current-sensing that generates a sensing current Is, which is proportional to the collector current Ic flowing through the main IGBT 111. The temperature detection diode DI is provided in the vicinity of the main IGBT 111 as an element for detecting the temperature of the main IGBT 111.

A collector electrode C is connected to the collector of the main IGBT 111 and the collector of the sensing IGBT 112. The gate of the main IGBT 111 is connected to the gate of the sensing IGBT 112 and an output end of the driving circuit 121. The main emitter of the main IGBT 111 is connected to GND. A sensing emitter of the sensing IGBT 112 is connected to an input end of the current detection circuit 123 and one end of the sensing resistor Rs. The other end of the sensing resistor Rs is connected to GND.

The anode of the temperature detection diode DI is connected to the input end of the temperature detection circuit 122 and the output end of the constant current source IR. The cathode of the temperature detection diode DI is connected to GND.

In the control circuit 120, the driving circuit 121 generates a driving signal s11 for driving the main IGBT 111 based on a driving control signal s0 transmitted via an input terminal In. A power supply voltage Vcc is applied to the constant current source IR, which outputs the constant current Iref.

The temperature detection circuit 122 detects an overheating state of the main IGBT 111. When doing so, the potential generated when the constant current Iref outputted from the constant current source IR flows through the temperature detection diode DI is inputted into the temperature detection circuit 122 as a temperature detection voltage Vdi. The temperature detection circuit 122 detects the temperature state of the main IGBT 111 based on this temperature detection voltage Vdi, and outputs an overheating detection signal s12 when the temperature state of the main IGBT 111 is detected as being an overheating state.

The current detection circuit 123 detects an overcurrent state of the main IGBT 111. When doing so, once the main IGBT 111 has been turned on based on the driving signal s11, the sensing IGBT 112 is also turned on and the sensing current Is is outputted from the sensing emitter of the sensing IGBT 112.

The sensing current Is outputted from the sensing IGBT 112 is inputted into the control circuit 120. The potential generated when this sensing current Is flows through the sensing resistor Rs is inputted into the current detection circuit 123 as a sensing voltage Vs. The current detection circuit 123 detects the current state of the main IGBT 111 based on this sensing voltage Vs, and outputs an overcurrent detection signal s13 when the current state has been detected as being an overcurrent state.

When the protection circuit 124 has received at least one of the overheating detection signal s12 and the overcurrent detection signal s13, the protection circuit 124 outputs a driving stop signal s14 to the driving circuit 121. When the driving circuit 121 has received this driving stop signal s14, the driving circuit 121 turns off the main IGBT 111 and thereby stops driving the main IGBT 111.

Figure 3:
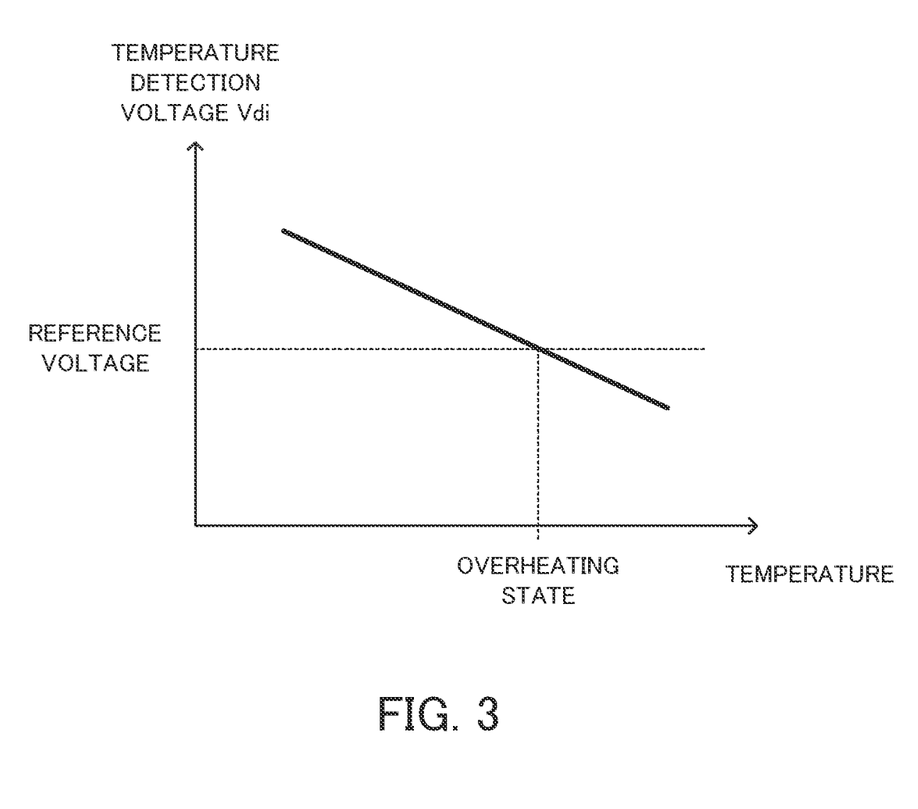
FIG. 3 depicts temperature characteristics of a temperature detection diode.

FIG. 3 depicts the temperature characteristics of a temperature detection diode. The vertical axis indicates the temperature detection voltage Vdi and the horizontal axis indicates the temperature. The temperature detection diode DI has a negative temperature characteristic where the temperature detection voltage Vdi decreases as the temperature rises.

Accordingly, the temperature detection voltage Vdi (a forward voltage) at the anode of the temperature detection diode DI, which is based on the constant current Iref that flows from the constant current source IR toward the temperature detection diode DI, will decrease as the temperature rises. For this reason, the temperature detection circuit 122 detects that the temperature state of the main IGBT 111 is the overheating state when the temperature detection voltage Vdi becomes equal to or lower than a reference voltage.

In the semiconductor device 100 described above, the sensing IGBT 112 incorporated into the IGBT chip 110 is used to detect the current flowing through the main IGBT 111, and the temperature detection diode DI incorporated into the IGBT chip 110 is used to detect the temperature at the main IGBT 111. In this way, the IGBT chip 110 uses separate elements for current detection and temperature detection, and has a built-in temperature detection diode DI for detecting temperature. Conversely, by using a configuration that enables detection of temperature and current with a single sensing element, the present disclosure provides a semiconductor device that simplifies the manufacturing process and reduces the chip area.

Figure 4:
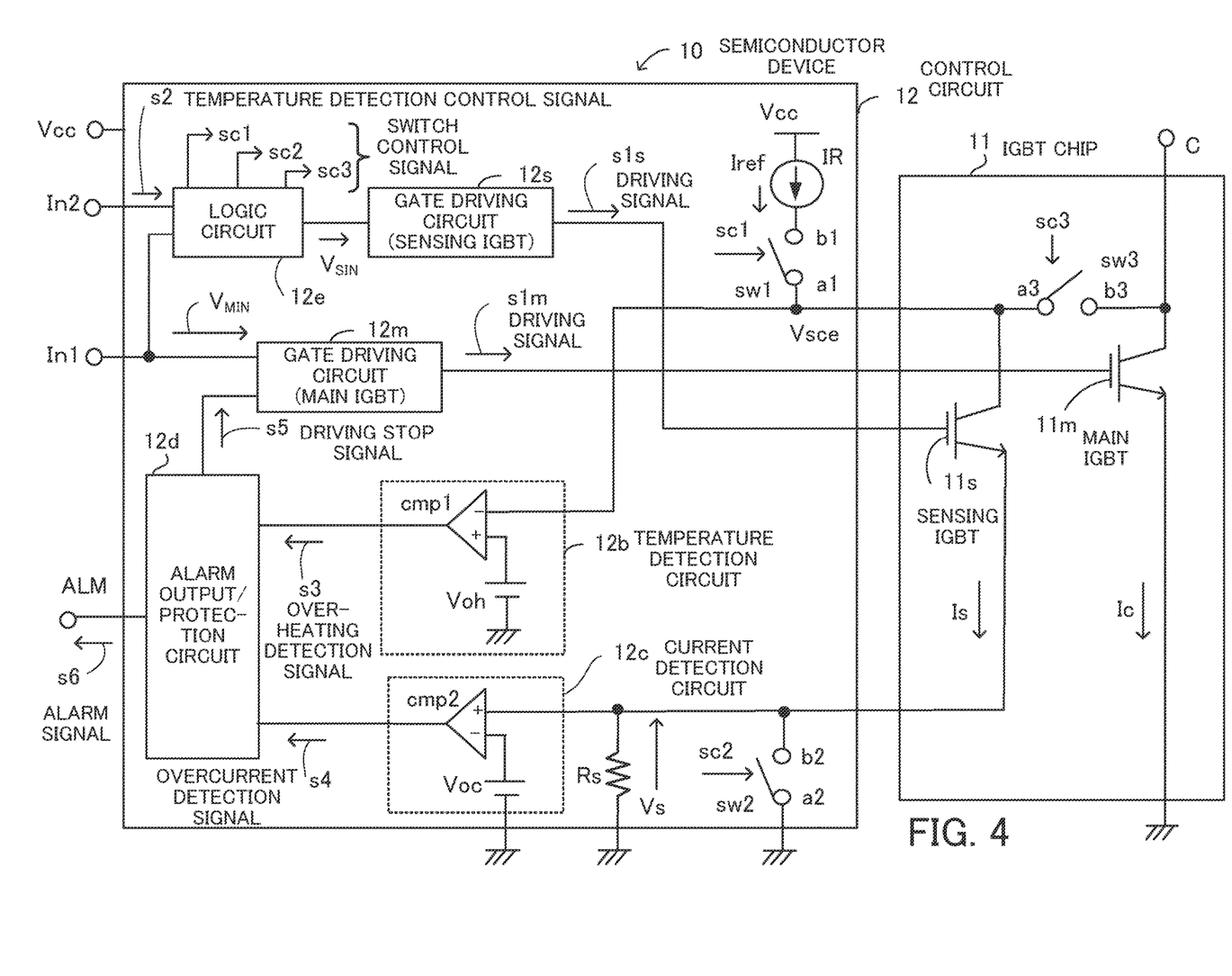
FIG. 4 depicts an example configuration of a semiconductor device.

Next, the configuration and operation of the semiconductor device 1 according to the present disclosure will be described in detail. FIG. 4 depicts an example configuration of a semiconductor device. As one example, the semiconductor device 10 is applied to an IPM, and includes an IGBT chip 11 and a control circuit 12. The IGBT chip 11 corresponds to the semiconductor device unit 1a in FIG. 1, and the control circuit 12 corresponds to the control circuit 1b in FIG. 1.

The IGBT chip 11 includes a main IGBT 11m, a sensing IGBT 11s, and a switch sw3 (or "third switch"). The control circuit 12 includes a gate driving circuit (for the main IGBT) 12m, a gate driving circuit (for the sensing IGBT) 12s, a temperature detection circuit 12b, a current detection circuit 12c, an alarm output/protection circuit 12d, a logic circuit 12e, a switch sw1 (or "first switch"), a switch sw2 (or "second switch"), a constant current source IR, and a sensing resistor Rs.

The temperature detection circuit 12b includes a comparator cmp1 and a reference voltage source that outputs a reference voltage Voh for temperature detection, and inputs the reference voltage Voh into a non-inverting input terminal (+) of the comparator cmp1. The current detection circuit 12c includes a comparator cmp2 and a reference voltage source that outputs a reference voltage Voc for current detection, and inputs the reference voltage Voc into the inverting input terminal (−) of the comparator cmp2.

Out of the switches sw1, sw2, and sw3, a first terminal a1 of the switch sw1 is connected to a first terminal a3 of the switch sw3, the collector of the sensing IGBT 11s, and the inverting input terminal (−) of the comparator cmp1. A second terminal b1 of the switch sw1 is connected to an output end of the constant current source IR. A power supply voltage Vcc is applied to the input terminal of the constant current source IR.

The first terminal a2 of the switch sw2 is connected to GND. A second terminal b2 of the switch sw2 is connected to the sensing emitter of the sensing IGBT 11s, one end of the sensing resistor Rs, and the non-inverting input terminal (+) of the comparator cmp2. A second terminal b3 of the switch sw3 is connected to the collector electrode C and the collector of the main IGBT 11m. Note that the main emitter of the main IGBT 11m and the other end of the sensing resistor Rs are connected to GND.

Here, the gate driving circuit 12m generates a driving signal s1m, which turns the main IGBT 11m on and off, based on the driving control signal $V_{MIN}$ transmitted for example from a microcomputer via an input terminal In1. The gate driving circuit 12m outputs this driving signal s1m to the gate of the main IGBT 11m to switch the main IGBT 11m. As one example, when the driving signal s1m is at an H level, the main IGBT 11m is turned on, and when the driving signal s1m is at an L level, the main IGBT 11m is turned off.

The logic circuit 12e outputs a driving control signal $V_{SIN}$ for driving the sensing IGBT 11s based on the driving control signal $V_{MIN}$ and a temperature detection control signal s2 transmitted for example from a microcomputer via an input terminal In2.

Based on the driving control signal $V_{MIN}$ and the temperature detection control signal s2, the logic circuit 12e additionally generates and outputs a switching control signal sc1 (or "first switching control signal"), a switching control signal sc2 (or "second switching control signal"), and a switching control signal sc3 (or "third switching control signal") for respectively switching the switches sw1, sw2, and sw3 on and off. Note that the internal configuration of the logic circuit 12e will be described later with reference to FIGS. 9 and 10.

The gate driving circuit 12s generates a driving signal s1s for turning the sensing IGBT 11s on and off based on the driving control signal $V_{SIN}$ (or "sensing element driving control signal") outputted from the logic circuit 12e, and outputs this driving signal s1s to the gate of the sensing IGBT 11s to switch the sensing IGBT 11s. As one example, when the driving signal s1s is at an H level, the sensing IGBT 11s is turned on, and when the driving signal s1s is at an L level, the sensing IGBT 11s is turned off.

(Switching Control)

Figure 5:
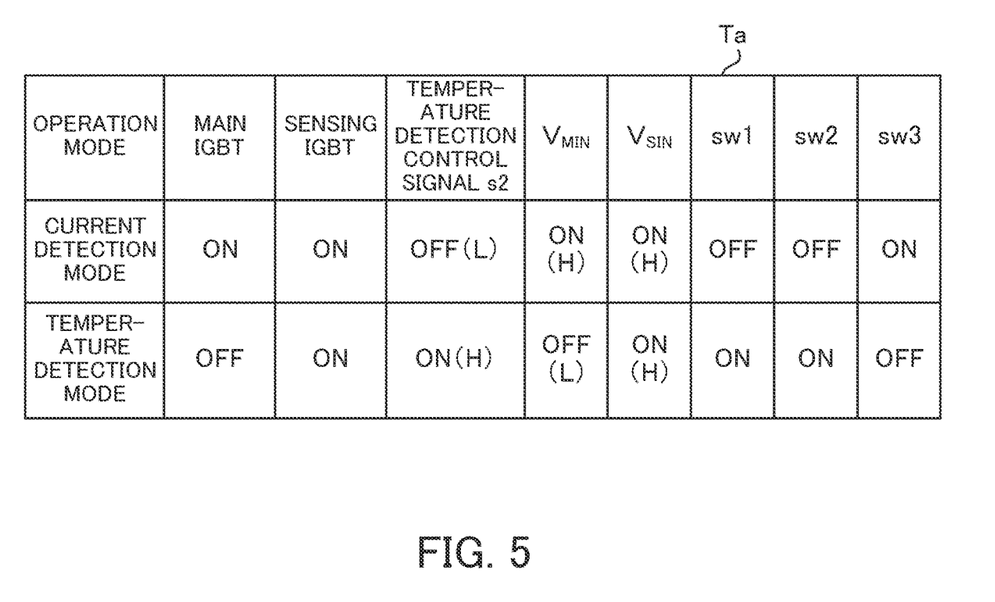
FIG. 5 depicts a switching operation of a switch.

FIG. 5 depicts a switching operation of a switch. Table Ta indicates the correspondence between the operation mode, on and off states of the main IGBT and sensing IGBT, the level of the temperature detection control signal s2, the level of the driving control signal $V_{MIN}$, the level of the driving control signal $V_{SIN}$, and the switching states (that is, the on/off states) of the switches sw1, sw2, and sw3.

[Current Detection Mode] The driving control signal $V_{MIN}$ is turned on and becomes the H level, which turns on the main IGBT 11m. The temperature detection control signal s2 becomes the L level, which turns off the temperature detection mode. When the logic circuit 12e receives the driving control signal $V_{MIN}$ at the H level and the temperature detection control signal s2 at the L level, the driving control signal $V_{SIN}$ is turned on and becomes the H level, which turns on the sensing IGBT 11s.

When the main IGBT 11m and the sensing IGBT 11s are both turned on, the switching control terminals of the switches sw1 and sw2 receive the switching control signals sc1 and sc2 outputted from the logic circuit 12e, respectively, and are turned off, and the switching control terminal of the switch sw3 receives the switching control signal sc3 outputted from the logic circuit 12e and is turned on. With the switches in this state, the sensing IGBT 11s functions as a current sensing element and the control circuit 12 enters the current detection mode.

[Temperature Detection Mode] The driving control signal $V_{MIN}$ is turned off and becomes the L level, which turns off the main IGBT 11m. In addition, the temperature detection control signal s2 becomes the H level, which turns on the temperature detection mode. When the logic circuit 12e receives the driving control signal $V_{MIN}$ at the L level and the temperature detection control signal s2 at the H level, the driving control signal $V_{SIN}$ is turned on and becomes the H level, which turns on the sensing IGBT 11s.

When the main IGBT 11m is turned off and the sensing IGBT 11s is turned on, the switching control terminals of the switches sw1 and sw2 receive the switching control signals sc1 and sc2 outputted from the logic circuit 12e, respectively and are both turned on. In addition, the switching control terminal of the switch sw3 receives the switching control signal sc3 outputted from the logic circuit 12e and is turned off. With the switches in this state, the sensing IGBT 11s functions as a temperature sensing element and the control circuit 12 enters the temperature detection mode.

(Current Detection Mode)

Figure 6:
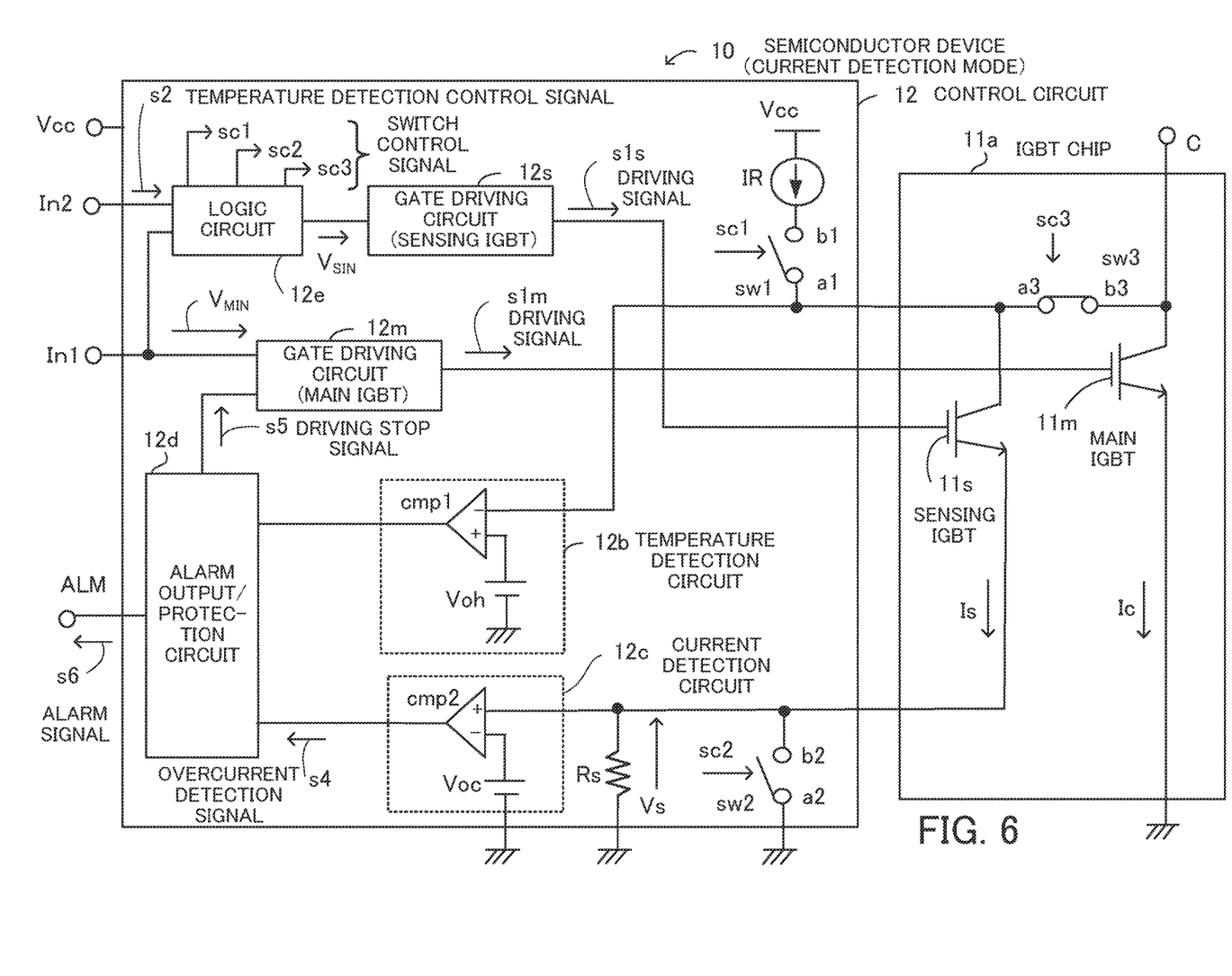
FIG. 6 depicts the configuration of a semiconductor device in a switching state during a current detection mode.

FIG. 6 depicts the configuration of a semiconductor device in a switching state during the current detection mode. In the current detection mode, as described above, the switch sw1 is off, the switch sw2 is off, and the switch sw3 is on.

When the switch sw1 is turned off, the output end of the constant current source IR and the collector (or "first high potential terminal") of the sensing IGBT 11s are disconnected. When the switch sw2 is turned off, the sensing emitter (or "low potential terminal") of the sensing IGBT 11s becomes ungrounded. When the switch sw3 is turned on, the collector of the sensing IGBT 11s and the collector (or "second high potential terminal") of the main IGBT 11m are connected.

When the switches are in this state, the sensing current Is outputted from the sensing emitter of the sensing IGBT 11s flows toward the current detection circuit 12c. Since one end of the sensing resistor Rs is connected to the non-inverting input terminal (+) of the comparator cmp2 of the current detection circuit 12c and the other end of the sensing resistor Rs is connected to GND, the potential generated by the current Is flowing through the sensing resistor Rs is inputted into the comparator cmp2 as the sensing voltage Vs.

The comparator cmp2 compares the sensing voltage Vs with the reference voltage Voc used for current detection. When the sensing voltage Vs is equal to or higher than the reference voltage Voc, the comparator cmp2 detects that the current state of the main IGBT 11m is an overcurrent state and outputs an overcurrent detection signal s4 (at the H level).

(Temperature Detection Mode)

Figure 7:
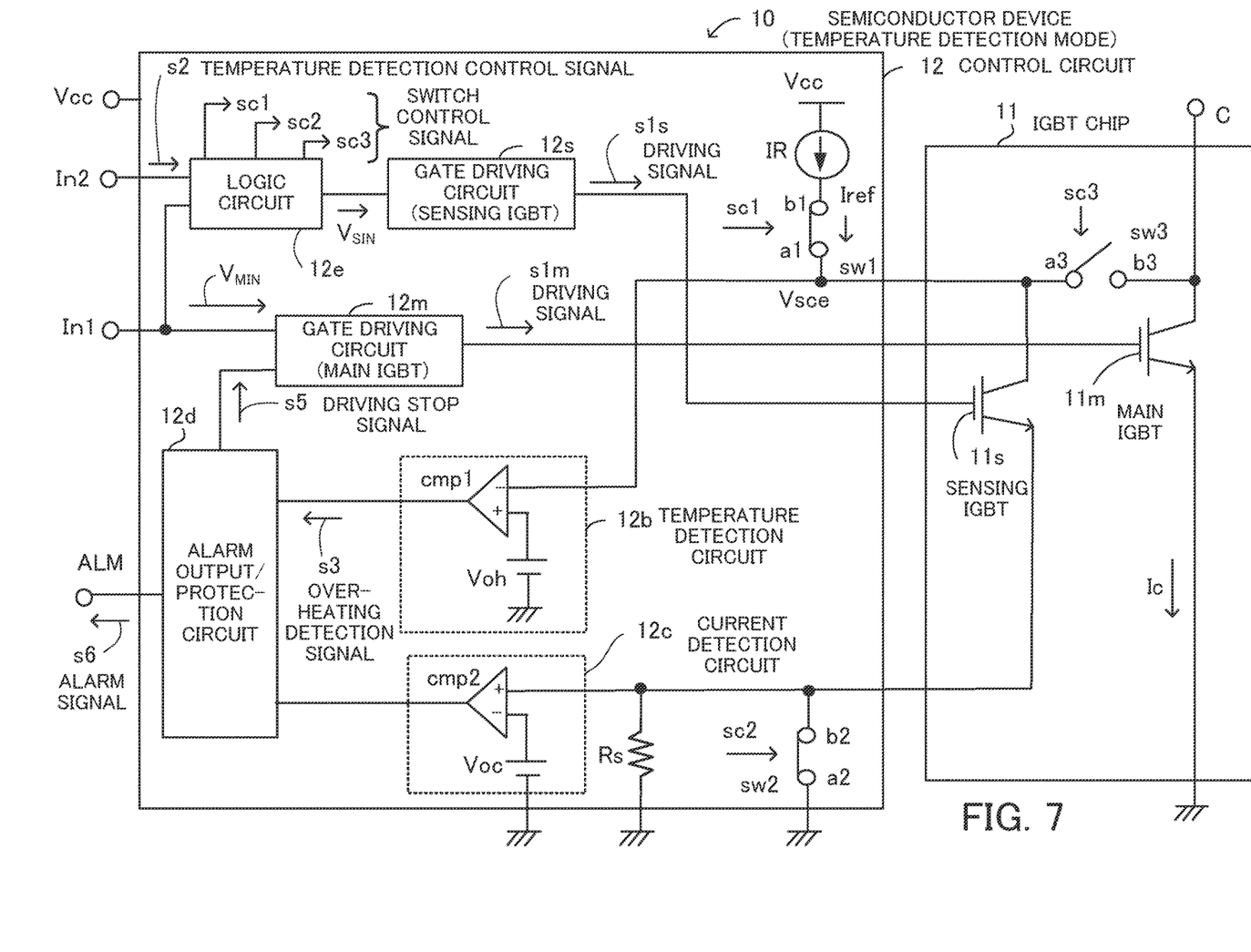
FIG. 7 depicts the configuration of a semiconductor device in a switching state during a temperature detection mode.

FIG. 7 depicts the configuration of a semiconductor device in a switching state during a temperature detection mode. In the temperature detection mode, as described above, the switch sw1 is on, the switch sw2 is on, and the switch sw3 is off.

When the switch sw1 is turned on, the output end of the constant current source IR and the collector of the sensing IGBT 11s are connected. When the switch sw2 is turned on, the sensing emitter of the sensing IGBT 11s is grounded. When the switch sw3 is turned off, the collector of the sensing IGBT 11s and the collector of the main IGBT 11m are disconnected.

With the switches in this state, the constant current Iref outputted from the constant current source IR flows to the sensing IGBT 11s. The collector-sensing emitter voltage, which is a potential generated at the sensing IGBT 11s at this time, is inputted into the comparator cmp1 of the temperature detection circuit 12b as a temperature detection voltage Vsce indicating the temperature state of the main IGBT 11m.

The comparator cmp1 compares the temperature detection voltage Vsce with the reference voltage Voh for temperature detection. On detecting based on the comparison result that the temperature state of the main IGBT 11m is the overheating state, the comparator cmp1 outputs an overheating detection signal s3 (at the H level).

Figure 8:
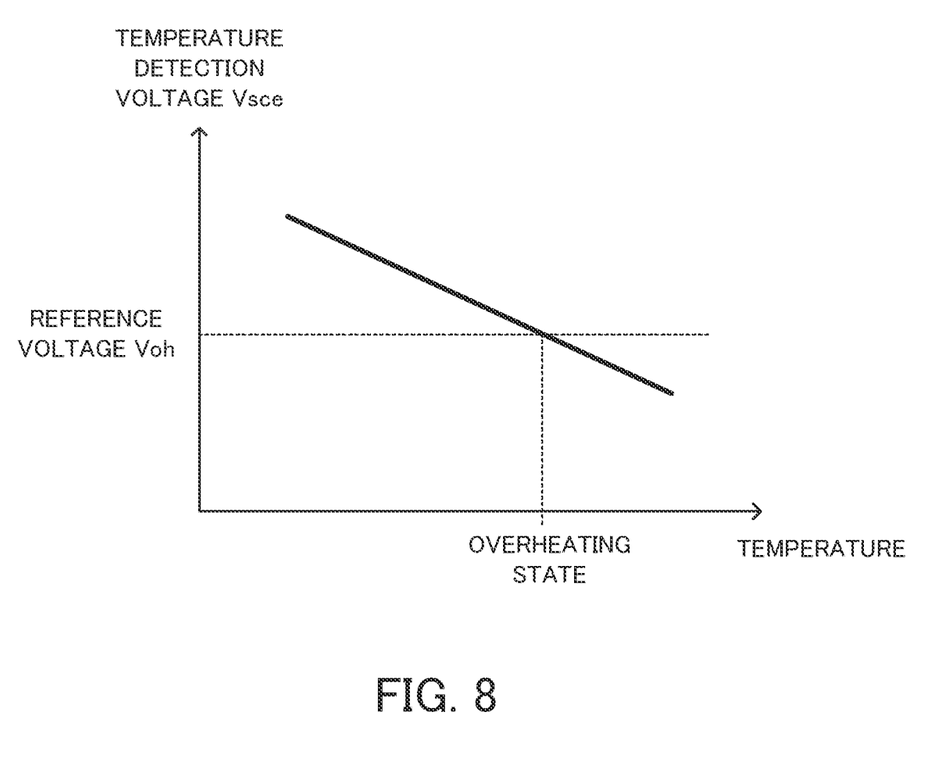
FIG. 8 depicts temperature characteristics of a sensing IGBT.

FIG. 8 depicts the temperature characteristics of the sensing IGBT. The vertical axis is the temperature detection voltage Vsce and the horizontal axis is the temperature. The sensing IGBT 11s has a negative temperature characteristic whereby the temperature detection voltage Vsce decreases as the temperature rises.

Accordingly, the temperature detection voltage Vsce between the collector and sensing emitter of the sensing IGBT 11s, which is based on the constant current Iref flowing from the constant current source IR toward the sensing IGBT 11s, decreases as the temperature rises. For this reason, when the temperature detection voltage Vsce has become equal to or lower than the reference voltage Voh, the comparator cmp1 of the temperature detection circuit 12b detects that the temperature state of the main IGBT 11m is the overheating state.

(Alarm Output and Protection)

When the alarm output/protection circuit 12d has received at least one of the overheating detection signal s3 and the overcurrent detection signal s4, the alarm output/protection circuit 12d outputs an alarm signal s6 via an output terminal ALM to notify the periphery of an alarm state. When the alarm output/protection circuit 12d has received at least one of the overheating detection signal s3 and the overcurrent detection signal s4, the alarm output/protection circuit 12d also outputs a driving stop signal s5 to the gate driving circuit 12m. On receiving this driving stop signal s5, the gate driving circuit 12m turns off the main IGBT 11m and stops driving the main IGBT 11m.

(Example Configuration of Logic Circuits)

Figure 9:
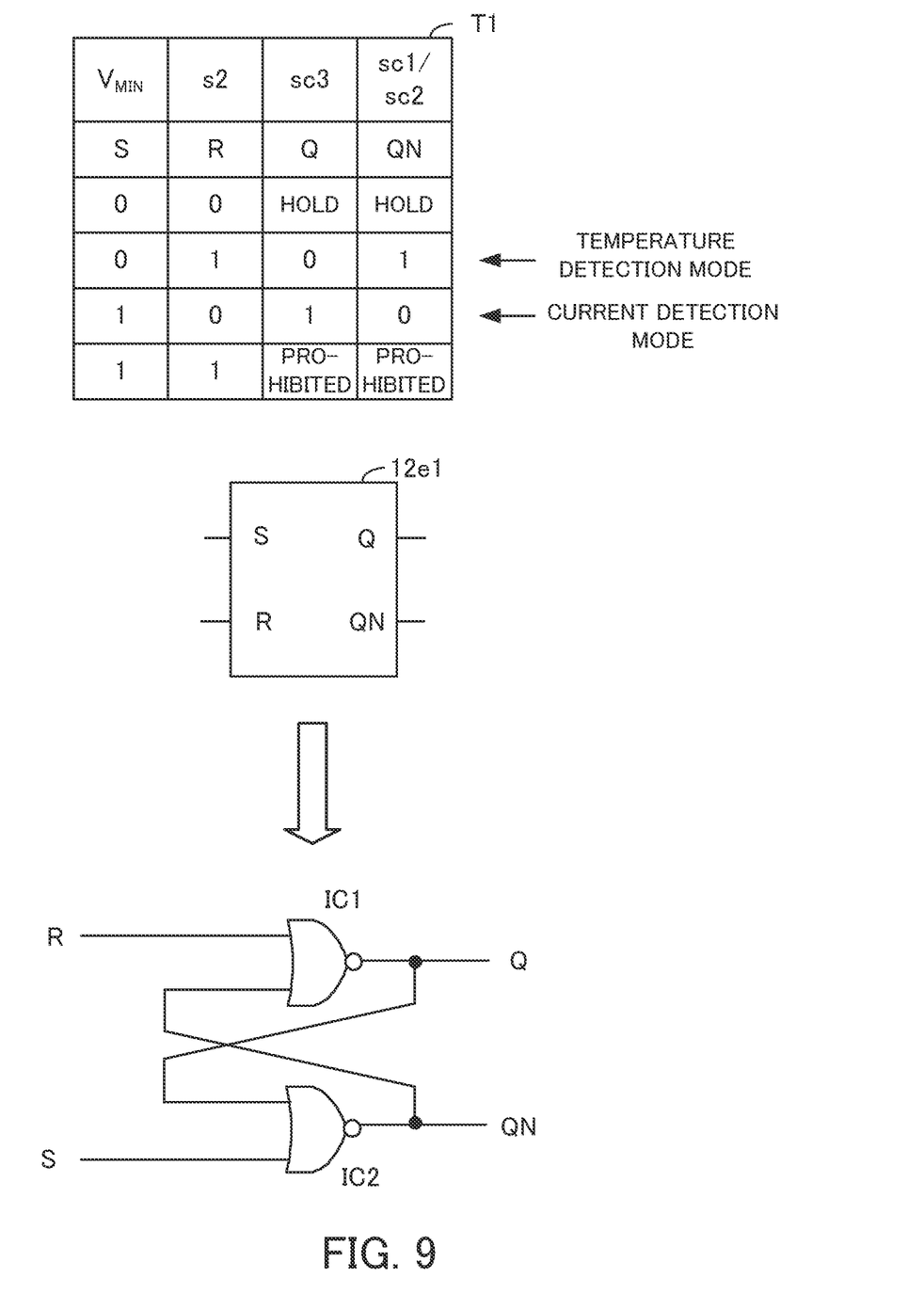
FIG. 9 depicts one example configuration of a logic circuit.
Figure 10:
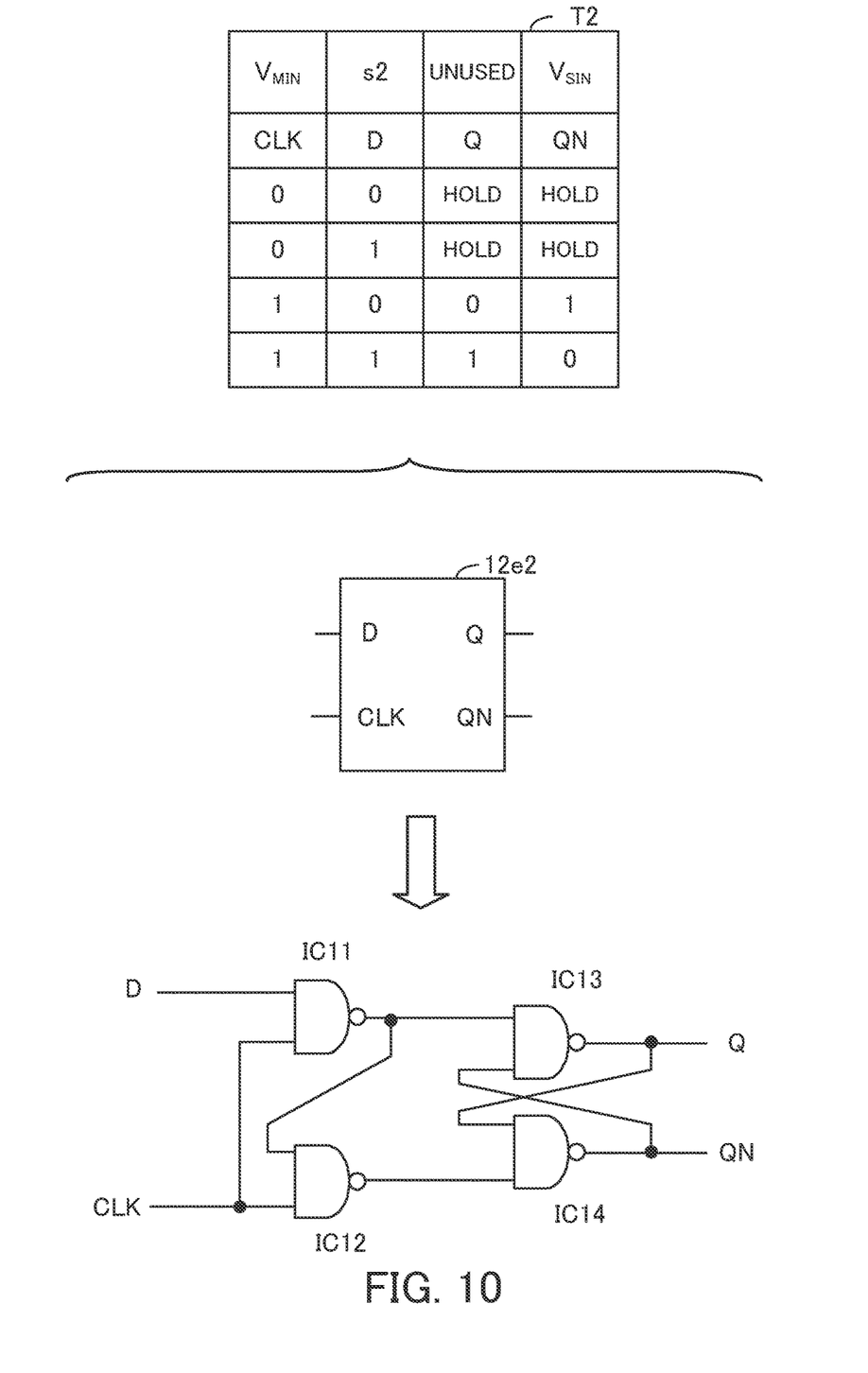
FIG. 10 depicts one example configuration of a logic circuit.

FIGS. 9 and 10 depict example configurations of logic circuits. The logic circuit 12e includes an RS type flip-flop 12e1 and a D type flip-flop 12e2.

At the RS type flip-flop 12e1 depicted in FIG. 9, the driving control signal $V_{MIN}$ is inputted into a set terminal (S), and the temperature detection control signal s2 is inputted into a reset terminal (R). The switching control signal sc3 is outputted from the output terminal Q, and the output from the inverting output terminal QN is used as the switching control signals sc1 and sc2.

In a truth table T1 of the RS type flip-flop 12e1 of this configuration, when $(V_{MIN}, s2)=(S, R)=(0, 0)$, (sc3, sc1/sc2)=(Q, QN)=(hold, hold), so that the output levels are held.

When $(V_{MIN}, s2)=(S, R)=(0, 1)$, (sc3, sc1/sc2)=(Q, QN)=(0, 1), which sets the temperature detection mode. That is, since the switching control signal sc3 is the L level and the switching control signals sc1 and sc2 become the H level, the switch sw3 is turned off and the switches sw1 and sw2 are turned on, so that the sensing IGBT 11s becomes a temperature sensing element and enters the temperature detection mode.

Additionally, when $(V_{MIN}, s2)=(S, R)=(1, 0)$, (sc3, sc1/sc2)=(Q, QN)=(1, 0), which sets the current detection mode. That is, since the switching control signal sc3 becomes the H level and the switching control signals sc1 and sc2 become the L level, the switch sw3 is turned on and the switches sw1 and sw2 are turned off, so that the sensing IGBT 11s becomes a current sensing element and enters the current detection mode.

Note that when $(V_{MIN}, s2)=(S, R)=(1, 1)$, (sc3, sc1/sc2)=(Q, QN)=(prohibited, prohibited) (that is, a setting where $V_{MIN}=s2=H$ level is not performed).

The RS type flip-flop 12e1 includes two-input, one-output NOR elements IC1 and IC2. One terminal of the NOR element IC1 is used as the reset terminal (R), and one terminal of the NOR element IC2 is used as the set terminal (S). The output terminal of the NOR element IC1 is used as the output terminal Q, and the output terminal of the NOR element IC2 is used as the inverting output terminal QN. The other input terminal of the NOR element IC1 is connected to the inverting output terminal QN of the NOR element IC2, and the other input terminal of the NOR element IC2 is connected to the output terminal Q of the NOR element IC1.

At the D-type flip-flop 12e2 depicted in FIG. 10, the driving control signal $V_{MIN}$ is inputted into the clock terminal (CLK), and the temperature detection control signal s2 is inputted into the input terminal (D). The driving control signal $V_{SIN}$ is outputted from the inverting output terminal QN (the output terminal Q remains unused).

In a truth table T2 of the D-type flip-flop 12e2, when $(V_{MIN}, s2)=(CLK, D)=(0, 0)$, $V_{SIN}=QN=$hold, so that the output levels are held. When $(V_{MIN}, s2)=(CLK, D)=(0, 1)$, $V_{SIN}=QN=$hold, so that the output levels are held.

When $(V_{MIN}, s2)=(CLK, D)=(1, 0)$, $V_{SIN}=QN=1$, so that the sensing IGBT 11s is turned on. Note that when $(V_{MIN}, s2)=(CLK, D)=(1, 1)$, $V_{SIN}=QN=0$, but since a setting of $V_{MIN}=s2=$H level is not performed, this logic state is not used.

The D-type flip-flop 12e2 includes two-input, one-output NAND elements IC11, IC12, IC13, and IC14. One terminal of the NAND element IC11 is used as an input terminal (D) and one terminal of the NAND element IC12 is used as the clock terminal (CLK). The output terminal of the NAND element IC13 is used as the output terminal Q and the output terminal of the NAND element IC14 is used as the inverting output terminal QN.

The other input terminal of the NAND element IC11 is connected to the clock terminal (CLK). The other input terminal of the NAND element IC12 is connected to the output terminal of the NAND element IC11 and one input terminal of the NAND element IC13.

The output terminal of the NAND element IC12 is connected to one input terminal of the NAND element IC14. The other input terminal of the NAND element IC13 is connected to the inverting output terminal QN of the NAND element IC14, and the other input terminal of the NAND element IC14 is connected to the output terminal Q of the NAND element IC13.

(Modification of Semiconductor Device)

Figure 11:
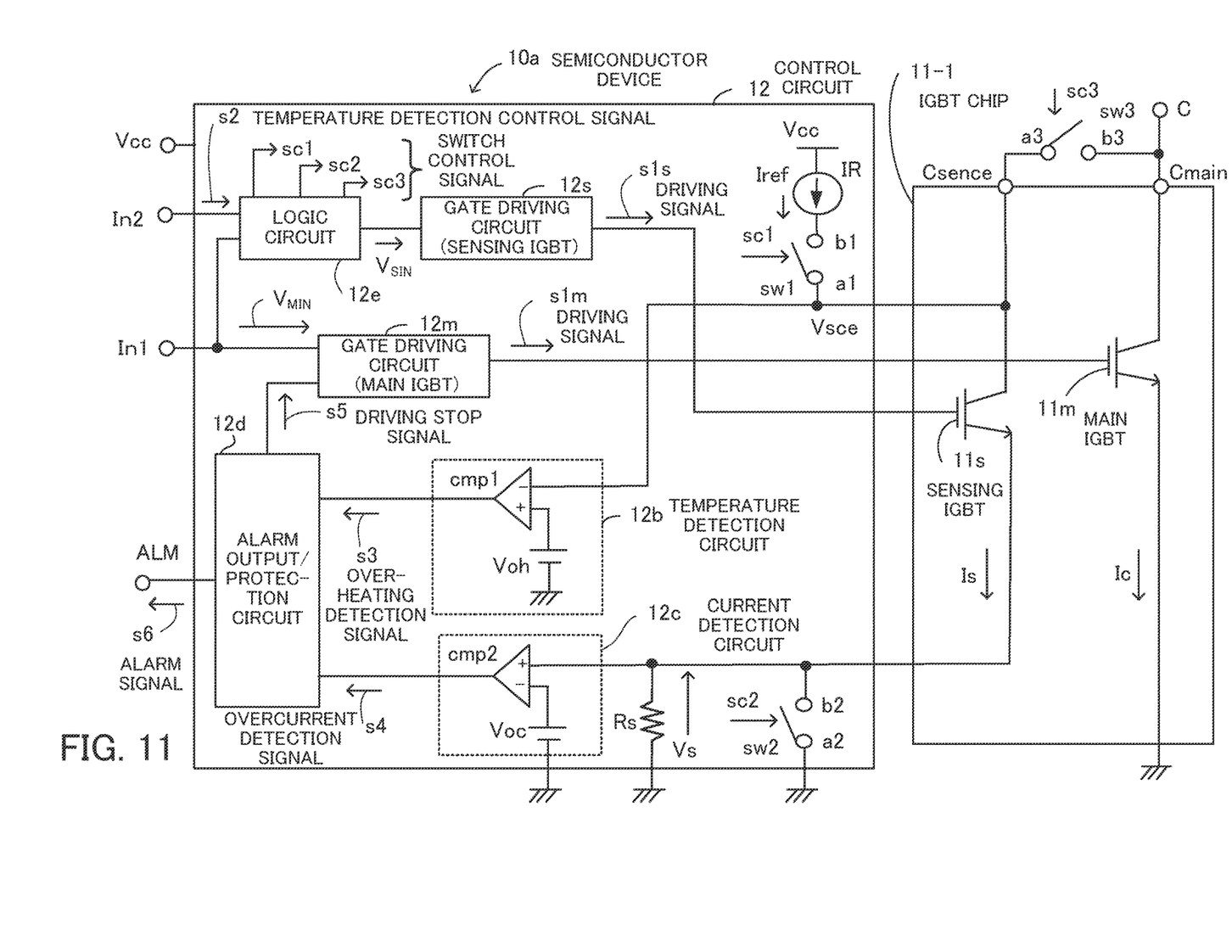
FIG. 11 depicts a modification of a semiconductor device.

FIG. 11 depicts a modification of the semiconductor device. In a semiconductor device 10a, the switch sw3 is disposed outside an IGBT chip 11-1, but the other configurations are the same as in FIG. 4. The first terminal a3 of the switch sw3 is connected via a terminal Csense to the inverting input terminal (−) of the comparator cmp1, the first terminal a1 of the switch sw1, and the collector of the sensing IGBT 11s. The second terminal b3 of the switch sw3 is connected to the collector electrode C and via the terminal Cmain to the collector of the main IGBT 11m.

In this way, by using an external-type configuration where the main IGBT 11m and the sensing IGBT 11s are incorporated in the IGBT chip 11-1 but the switch sw3 is disposed outside, it is possible to reduce the circuit scale of the IGBT chip 11-1.

(Application to High-Side Circuit)

Figure 12:
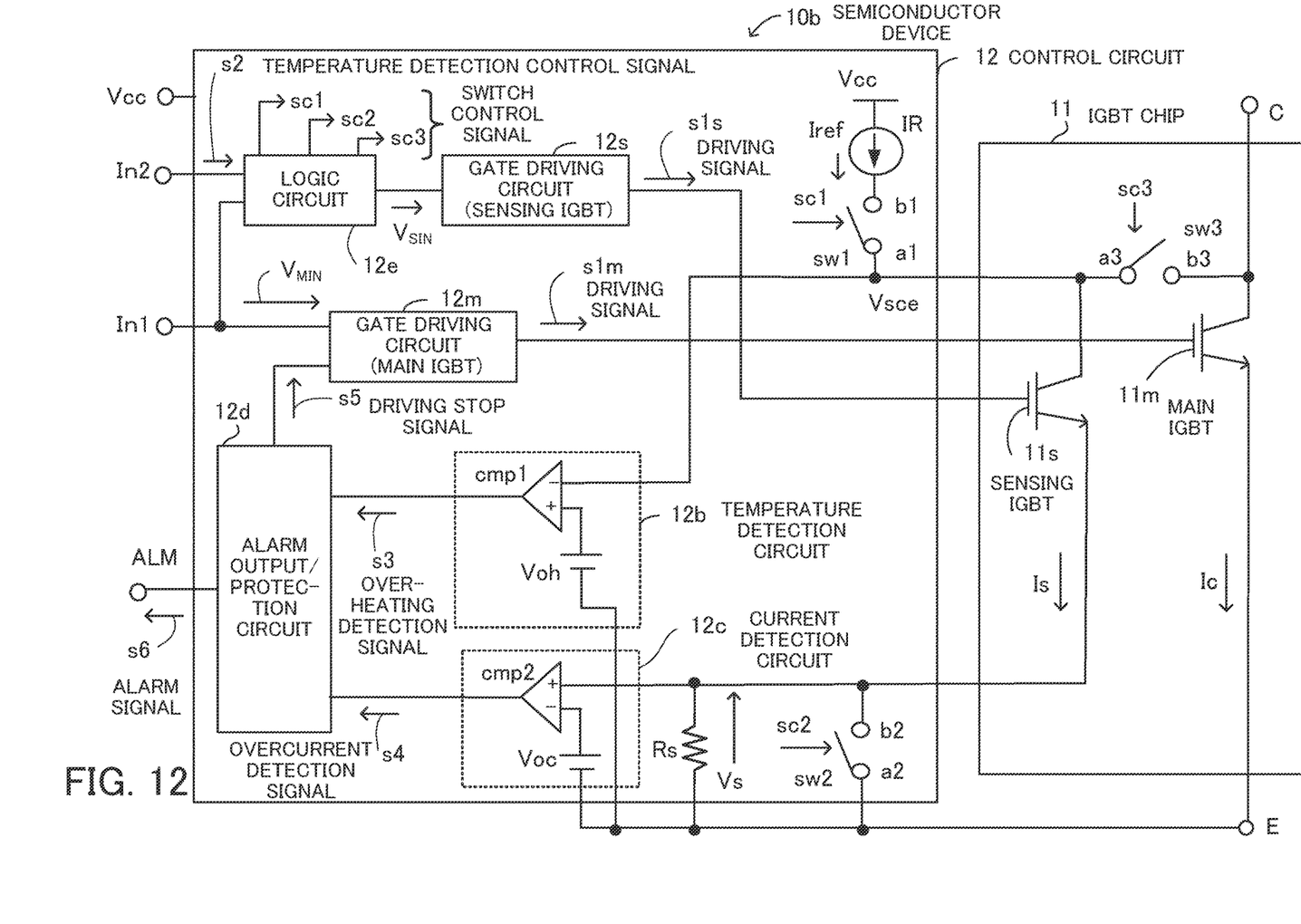
FIG. 12 depicts an example of a semiconductor device that has been applied to a high-side circuit.

FIG. 12 depicts an example of a semiconductor device that has been applied to a high-side circuit. Although the semiconductor device 10 described above is configured for a low-side circuit application, a semiconductor device 10b in FIG. 12 has been configured for a high-side circuit application.

In the semiconductor device 10b, the emitter of the main IGBT 11m is connected to the first terminal a2 of the switch sw2, the other end of the sensing resistor Rs, the negative terminal of the reference voltage source that outputs the reference voltage Voc, and the negative terminal of the reference voltage source that outputs the reference voltage Voh. Other configurations are the same as in FIG. 4.

As described above, according to the present disclosure, since the sensing element is configured to be capable of both current detection and temperature detection of the output element, a temperature detection diode may be omitted, the manufacturing process is simplified, and there is a further effect of a reduction in chip area.

Although embodiments of the present embodiment have been described above, the configuration of each part indicated in the embodiments may be replaced with other parts with similar functions. As one example, a wide bandgap semiconductor such as silicon carbide (SiC) may be used as the output element. It is also possible to add other optionally chosen components or processes. Any two or more configurations (or features) in the embodiment described above may also be combined into single elements.

According to an aspect of the present disclosure, it is possible to simplify a manufacturing process and to reduce chip area.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A semiconductor device for driving a load, comprising:
a semiconductor device unit, including
an output element that performs switching to operate the load, the output element having a high potential terminal, and
a sensing element having a high potential terminal and a low potential terminal; and
a control circuit coupled to the semiconductor device unit, the control circuit being configured to be operable,
when the output element is in an on state, to turn on the sensing element by connecting the high potential terminal of the sensing element to the high potential terminal of the output element and ungrounding the low potential terminal of the sensing element, to thereby cause the sensing element to function as a current sensing element for detecting a current flowing in the output element, and
when the output element is in an off state, to cut off a connection between the high potential terminal of the sensing element and the high potential terminal of the output element, to supply a constant current from the high potential terminal of the sensing element in a state where the low potential terminal of the sensing element is grounded, to thereby turn on the sensing element and cause the sensing element to function as a temperature sensing element for detecting a temperature of the output element.

2. The semiconductor device according to claim 1, wherein
the control circuit includes:
a logic circuit,
a constant current source having an output end,
a first switch that connects or disconnects the output end of the constant current source and the high potential terminal of the sensing element, and
a second switch that grounds or ungrounds the low potential terminal of the sensing element;
the semiconductor device further includes a third switch that connects or disconnects the high potential terminal of the sensing element and the high potential terminal of the output element and that is disposed inside or outside the semiconductor device unit; and the logic circuit is configured to generate and output, based on a level of a driving control signal for switching the output element and a level of a temperature detection control signal,
- a first switching control signal for performing switching control of the first switch,
- a second switching control signal for performing switching control of the second switch, and
- a third switching control signal for performing switching control of the third switch.

3. The semiconductor device according to claim 2, wherein the logic circuit is configured to be operable, responsive to the driving control signal being at a level that turns on the output element and the temperature detection control signal being at a level that causes the sensing element to function as the current sensing element,
- to turn off the first switch with the first switching control signal, to thereby disconnect the output end of the constant current source from the high potential terminal of the sensing element,
- to turn off the second switch with the second switching control signal, to thereby unground the low potential terminal of the sensing element, and
- to turn on the third switch with the third switching control signal, to thereby connect the high potential terminal of the sensing element to the high potential terminal of the output element, and cause the sensing element to function as the current sensing element.

4. The semiconductor device according to claim 2, wherein the logic circuit is configured to be operable, responsive to the driving control signal being at a level that turns off the output element and the temperature detection control signal being at a level that causes the sensing element to function as the temperature sensing element,
- to turn on the first switch with the first switching control signal, to thereby connect the output end of the constant current source to the high potential terminal of the sensing element,
- to turn on the second switch with the second switching control signal, to thereby ground the low potential terminal of the sensing element, and
- to turn off the third switch with the third switching control signal, to thereby disconnect the high potential terminal of the sensing element from the high potential terminal of the output element, and cause the sensing element to function as the temperature sensing element.

5. The semiconductor device according to claim 2, wherein the logic circuit includes:
- an RS-type flip-flop having a set terminal, a reset terminal, an output terminal, and an inverting output terminal, and
- a D-type flip-flop having a clock terminal, an input terminal, and an inverting output terminal, wherein the RS-type flip-flop:
- receives the driving control signal at the set terminal thereof,
- receives the temperature detection control signal at the reset terminal thereof,
- outputs the third switching control signal from the output terminal thereof, and
- outputs the first switching control signal and the second switching control signal from the inverting output terminal thereof; and the D-type flip-flop:
- receives the driving control signal at the clock terminal thereof,
- receives the temperature detection control signal at the input terminal thereof, and
- outputs the sensing element driving control signal for driving the sensing element from the inverting output terminal thereof.

6. The semiconductor device according to claim 1, wherein the control circuit includes:
- a current detection resistor, which outputs the sensing current outputted from the current sensing element as a sensing current detection signal that is a voltage, and
- a current detection circuit, which detects a current state of the output element by comparing the sensing current detection signal with a current detection reference voltage.

7. The semiconductor device according to claim 1, wherein the control circuit includes a temperature detection circuit that detects a temperature state of the output element by comparing a sensing voltage detection signal, which is outputted from the temperature sensing element and falls due to a temperature characteristic of the sensing element when the constant current flows, with a temperature detection reference voltage.

\* \* \* \* \*